United States Patent [19]
Bentz et al.

[11] Patent Number: 4,763,224
[45] Date of Patent: Aug. 9, 1988

[54] HOUSING FOR RECEIVING ELECTRIC CONTROL DEVICES, IN PARTICULAR FOR MOTOR VEHICLES

[75] Inventors: Willy Bentz, Sachsenheim; Willi Gansert, Kornwestheim, both of Fed. Rep. of Germany

[73] Assignee: Robert Bosch GmbH, Stuttgart, Fed. Rep. of Germany

[21] Appl. No.: 19,243
[22] PCT Filed: Jan. 28, 1986
[86] PCT No.: PCT/DE86/00028
§ 371 Date: Oct. 9, 1986
§ 102(e) Date: Oct. 9, 1986
[87] PCT Pub. No.: WO86/06334
PCT Pub. Date: Nov. 6, 1986

[30] Foreign Application Priority Data
Apr. 20, 1985 [DE] Fed. Rep. of Germany ....... 3514440

[51] Int. Cl.⁴ .............................................. H05K 7/20
[52] U.S. Cl. .................................. 361/386; 165/80.3; 361/395; 361/415
[58] Field of Search ................ 357/81; 165/80.1, 80.2, 165/80.3; 211/41; 361/380, 383, 386, 387, 388, 392–395, 399, 412, 413, 415

[56] References Cited
U.S. PATENT DOCUMENTS

| | | | |
|---|---|---|---|
| 3,601,661 | 8/1971 | Kleinhample, Jr. | 361/395 |
| 4,480,287 | 10/1984 | Jensen | 361/386 |
| 4,498,119 | 2/1985 | Cronin | 361/415 |
| 4,546,407 | 10/1985 | Benenati | 361/395 |
| 4,628,413 | 12/1986 | Speraw | 361/415 |

Primary Examiner—G. P. Tolin
Attorney, Agent, or Firm—Michael J. Striker

[57] ABSTRACT

A housing for receiving electric control devices for motor vehicles, wherein the total motor vehicle electronics together with the detachable connecting means is mounted. The control devices (17 to 21) which are required, depending on the equipment of the motor vehicle, are individually installable into and removable from the housing and each is provided with a base plate which acts as a cooling part and has guiding edges insertable into guide grooves formed in the housing. The base plates are pushable tightly against the housing (1) by means of a locking device, so as to ensure a large heat dissipation face at both sides of each base plate, whereby the housing can only be tightly closed with a lid when the control devices are property installed and pressed against the heat dissipation faces of the housing.

8 Claims, 4 Drawing Sheets

HOUSING FOR RECEIVING ELECTRIC CONTROL DEVICES, IN PARTICULAR FOR MOTOR VEHICLES

BACKGROUND OF THE INVENTION

The invention relates to a housing for receiving electric control devices, in particular for motor vehicles, which is closable with a cover and wherein a central connecting plate is provided which has conductor paths and detachable connecting means for the voltage supply, and a sensor for each electric control device, whereby the control devices are provided with connecting means for a detachable connection with the control connecting plate and for a detachable connection to a laced wiring harness which feeds output signals of the control devices to the aggregates being controlled, whereby all connecting means are mounted in the closed housing.

Such a combination of a housing with the electric devices is already known, wherein all electric control devices which have to be mounted in the motor compartment of the motor vehicle are disposed in such a manner that numerous additional parts must be screwed on those devices. Thereby, it is disadvantageous that the heat discipation losses from the control devices, which are mounted in the tight housing, are prevented by the resistance at the many heat transfer locations, so that the insufficiently cooled control devices are no longer operable in a short time due to heat influences. Furthermore, with the numerous control devices which are mounted in the housing it is not assured that in case of assembly or servicing each of the control devices is mounted so that heat discipation losses are carried off.

SUMMARY OF THE INVENTION

It is an object of the invention to provide a housing for receiving different electric control devices, in particular for motor vehicles, for example, for an antiblocking system, drive control, motronic, ignition system, wherein it is possible to easily and detachably couple each control device with a large face directly to the housing for drawing off the energy heat and which is provided with simple means assuring a safe mounting and heat energy drawing off from the control devices.

The objects of this invention are attained by a housing for electric control devices, in which the electric control devices with their associated base face are pressed with a large face area against the housing by means of a simple clamping or locking device for each control device or a common device for all control devices, whereby this device or devices are so shaped that the housing with the lid can only be closed after all the control devices are properly mounted in the housing.

Particularly advantageous are the directly insulated or noninsulated disposition of the structural elements to be cooled on the base plate which acts as a cooling part. Moreover, the resilient tolerance compensation means which is mounted as a safety assembly are directly integrated in the clamping and locking device, so that during an insufficient mounting of a control device in the housing and thereby a poor cooling of the device, the lid cannot be tightly close the housing. The novel features which are considered as characteristic for the invention are set forth in particular in the appended claims. The invention itself, however, both as to its construction and its method of operation, together with additional objects and advantages thereof, will be best understood from the following description of specific embodiments when read in connection with the accompanying drawing.

DETAILED DESCRIPTION OF THE PREFERRED EMBODIMENTS

Figure 1:
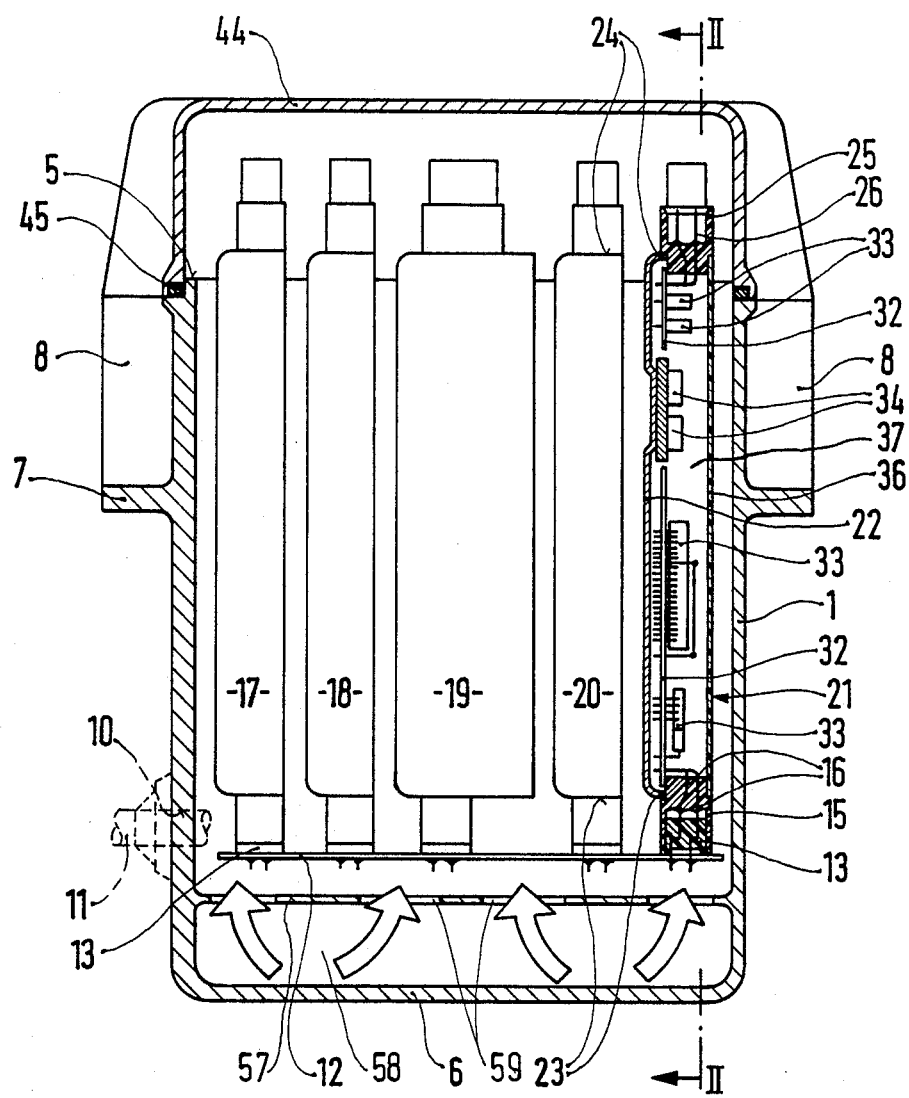
FIG. 1 illustrates a sectional view of the housing with five control devices in a modular arrangement.

A housing 1, for example, made from light metal is substantially shaped with a rectangular cross section. Parallel guide grooves 4 are molded on two opposite positioned inner walls 2 and 3, which grooves extend from the front face 5 at the open end of housing 1 to its bottom 6.

At the outside housing 1 is provided with a flange 7 which extends parallel to the front or end face 5 on which cooling ribs 8 are formed and mounting apertures 9 are provided for mounting the housing 1 on the chassis of the motor vehicle. Moreover the housing 1 is provided with an opening 10 for a tightly sealed insertion of conduits 11 for the voltage supply and for the sensor connection.

A central connecting plate 12 is mounted parallel to the bottom 6 of housing 1. For example, the connecting plate 12 is a printed circuit board and supports known conductor paths, which are not shown in particular, and parallel contact bars 13 with socket plugs 14. The plug sockets 14 are connected by means of associated conductor paths with the voltage supply and with associated sensors and as far as required, with plug sockets 14 of further contact bars 13. The contact bars 13 belong to first detachable connecting devices, whose associated counter socket plugs 15 are provided with plug pins or flat socket plugs 16 on electric control devices 17,18,19,20,21. Thus, the control devices 17 to 21 are connected to the voltage supply by the first connecting devices 13 to 16, while the associated sensors and indicator devices are connectable on the instrument panel and, if required, are detachably connectable to each other.

Each control device 17 to 21 has a base plate 22 which simultaneously acts as a cooling part. The base plate 22 is provided at two opposite sides with rectangular edges 23 and 24. The plug pins 16 of bars 15 are disposed at the edge 23 as shown in FIG. 1. A contact bar 25 of a second detachable connecting device and plug pins or flat plugs 26 are mounted at the edge 24 as also shown in FIG. 1. The associated counter socket bars 27 are provided with sockets 28 which are connected to conductors 29. Conductors 29 are connected to known aggregates which are controlled (not shown in detail), to which they feed the ouput signals of the associated control devices 17 to 21. For this purpose, the conductors 29 are assembled is a module like laced wiring harness.

Figure 3:
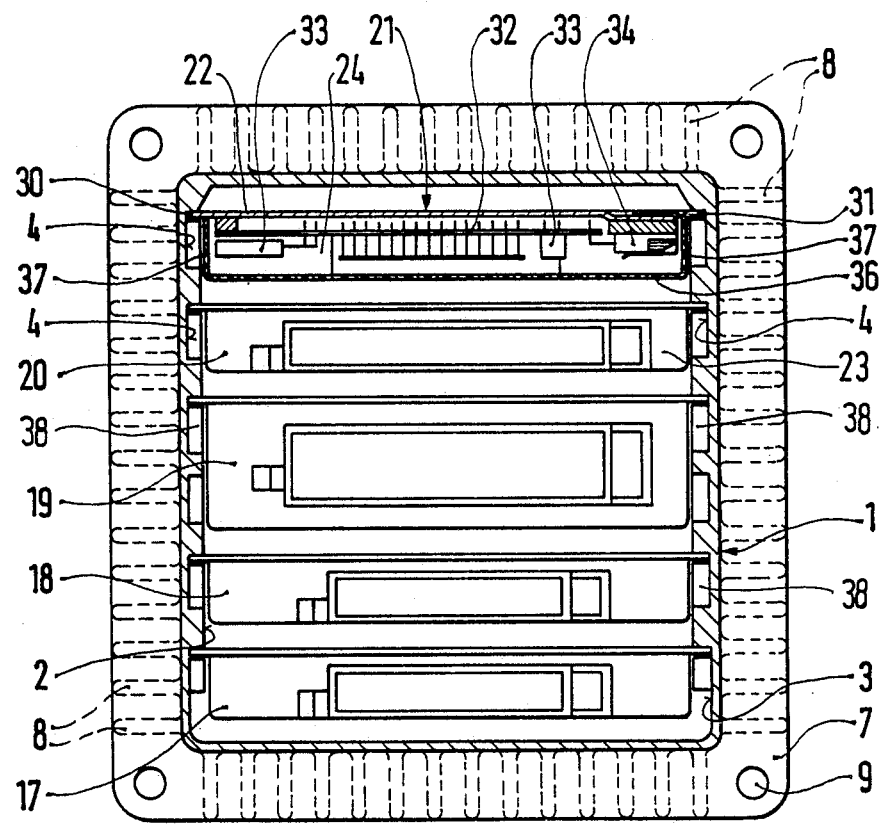
FIG. 3 is a section through the housing along line III—III in FIG. 2.

Guiding edges 30 and 31 are formed on the two opposite sides of the base plate 22 (FIG. 3). Each guiding edge is provided in a plane parallel to base plate 22. Each guiding edge 30 or 31 may also consist of a plurality of lugs.

Each control device 17 to 21 is provided with at least one printed circuit board 32 (FIG. 2) on which discrete and/or integrated structural components 33 are mounted. The structural components 33 are connected with each other on the printed circuit board 32 in a known manner, not shown in detail, by means of conductor paths, also not shown in detail. Structural components 34 which have to be cooled are directly mounted on the base plate 22, while connecting electrodes 35 of these structural components 34 are also connected with the printed circuit board 32 by means of associated conductor paths. The structural components 34 which have to be cooled may be insulated or noninsulated relative to base plate 22.

Each control device 17 to 21 is closed with a lid so as to prevent mechanical damages which may occur during the separated installation and disassembly of the individual control devices. A lid 36 is substantially formed like a plate and is provided with two rectangular lugs 37 on two opposite sides for gripping. For closing the control devices 17, 18, 19, 20 or 21 the lid 36 is placed onto the edges 23 and 24 of base plate 22 which receive the plug bar 15 and plug bar 25, respectively whereby the lugs 37 of lid 36 extend towards the inner sides of the guide edges 30, 31 of the base plate 22 as shown in FIG. 3.

Figure 2:
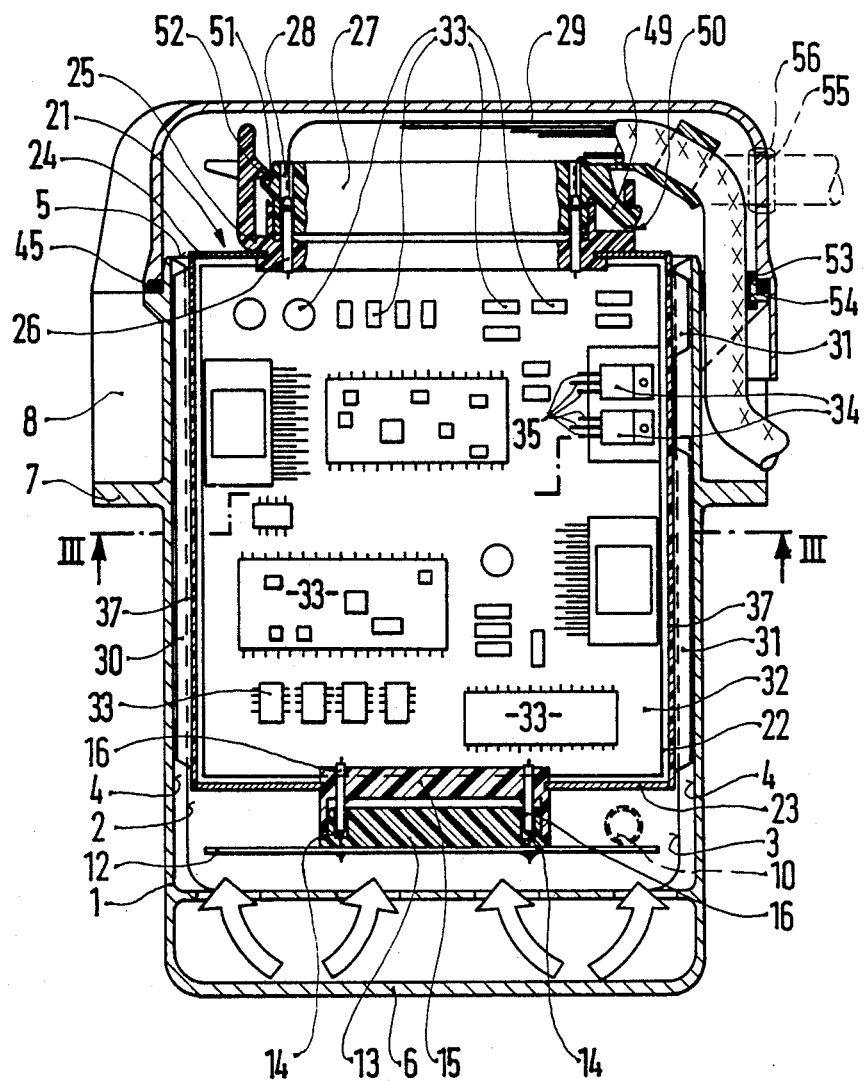
FIG. 2 is a section through the housing along line II—II of FIG. 1.

After each control device 17 to 21 is individually mounted, examined, compensated and closed, it is placed into housing 1 and its counter plug bar 15 is plugged into the associated contact bar 13 on the central connecting plate 12 as shown in FIG. 2. Thereby, the guiding edges 30 and 31 of the base plate 22 are received in the associated guide grooves 4 of housing 1 as shown in FIG. 3.

Figure 4:
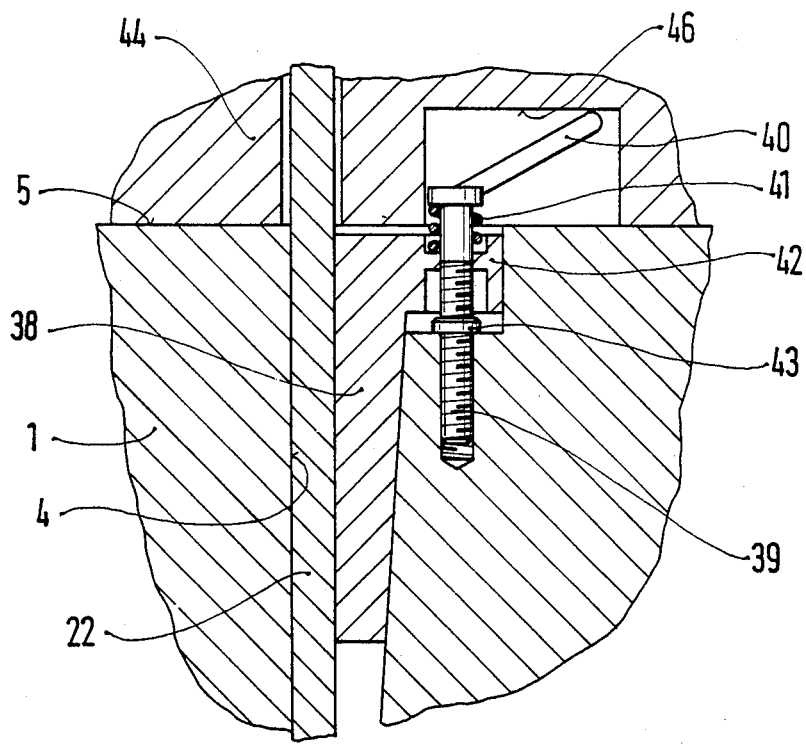
FIG. 4 is a partial section of the housing with a clamping and locking device.

The drawing off of energy heat for the structural components 34 mounted on base plate 22 is performed through the base plate 22 to housing 1 and, if further required, to the chassis of the motor vehicle in which housing 1 with the control devices 17 to 21 is installed. For an improved heat transfer from the guiding edges 30, 31 of the base plate 22 as shown in FIG. 3 to housing 1 a wedge 38 of a clamping and locking device (FIG. 4) is inserted into each of the guide grooves 4, which wedge presses the associated guiding edge 30 or 31 firmly into the guide groove 4, so as to facilitate heat transfer to housing 1 and to provide a large surface for drawing off heat on both sides of the base plate 22. Thereby, the wedge 38 is pushed into groove 4 by means of a collar screw 39. For example, the collar screw 39 is screwed with a thread having a large pitch or a bajonet lock into housing 1. Furthermore, a safety lever 40 is mounted on the head of the collar screw 39. A compression spring 41 is also seated on the collar screw 39. With one end this spring is supported on the head of the collar screw 39 and with the other end on a protrusion 42 of wedge 38 through which the collar screw 39 extends. A safety ring 43 is mounted on the collar screw 39 between the protrusion 42 of wedge 38 and housing 1 and enables a removing of the wedge 38 from guide groove 4 for releasing base plate 22. The compression spring 41 is used for a tolerance compensation of a control device with the base plate 22 and a lid 44 between housing 1, 4, whereby the lid tightly seals housing 1 which receives the control devices 17 to 21. A sealing ring 45 (FIGS. 1 and 2) is provided between the housing front face 5 and lid 44. The safety lever 40 extends into a recess 46 of lid 44. Only after the collar screw 39 has been tightened by the required amount and the desired cooling effect is obtained in this manner, only then can lid 44 is mounted. The safety lever 40 may also be formed as a central locking lever for all control devices 17 to 21 which are mounted in housing 1.

Figure 5:
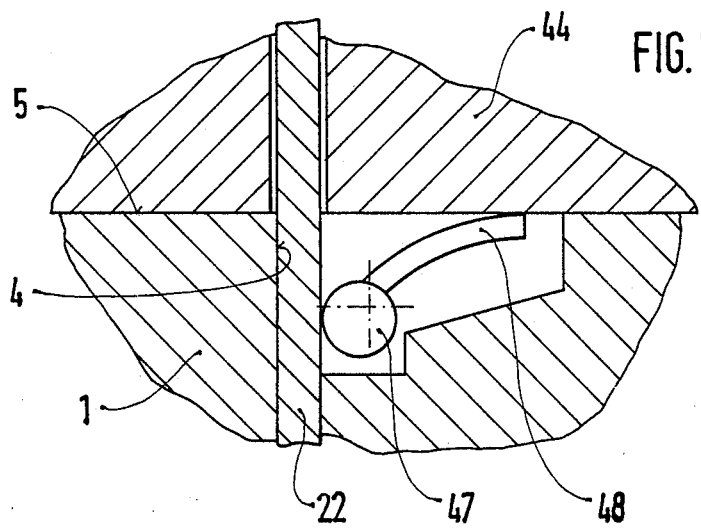
FIG. 5 is a partial sectional view of a modification of the device in accordance with FIG. 4.

In one modification of the clamping and locking device in accordance with FIG. 5, an eccentric 47 is rotatably mounted in housing 1. It is pressable against base plate 22 of one of the control devices 17 to 21 by means of an operating lever 48. Thereby, the guiding edge 30 or 31 of base plate 22 is firmly pushed into the guide groove 4 and against housing 1. The operating lever 48 is shaped as a resilient element and engages on lid 44. Thereby, lid 44 maintains the operating lever 48 in a tolerance compensating manner in housing 1 and the eccentic 47 in its contact position. The lid 44 is detachably mounted in a known manner and not shown in detail, for example, by means of screws on housing 1.

Depending on the type and number of the required control devices 17 to 21, for example, for motronic, antiblocking system, drive control, ignition system, the conductors 29 are collected in a module like structured laced wiring harness. The counter socket bars 27 of the second connection device may also be collected in a module plug. The counter socket bars 27 are provided each with one mounting hook 49 which engages into an opening 50 of the associated plug bar 25 as shown in FIG. 2. Moreover, the bars 27 are provided each with a locking hook 51 which engages with a pivotable locking lever 52 of plug bar 25 when the counter socket bar 27 is plugged in. Known coding means, which are not shown in detail, enable the connecting of only one counter socket bar 27 with the associated plug bar 25 of one of the control devices 17 to 21. The counter socket bars 27 which are collected in the module plug are mounted in housing 1 which is tightly closed by means of lid 44. The module like structured laced wiring harness from conductors 29 is sealed and fed by means of a sealing part 53 through an opening 54 of housing 1 to the aggregates to be controlled. The structured laced wiring harness may also be fed from housing 1 through a bore 55 of lid 44 in which a sealing ring 56 is mounted.

If the housing 1 with control devices 17 to 21 can only be installed at only one location in the motor vehicle, whose ambient temperature requires a further cooling, such a cooling may be performed by a forced convection within housing 1. For this purpose, for example, an intermediate bottom wall 57 (FIG. 1) is formed in housing 1 between bottom 7 and connecting plate 12, which limits a chamber 58, for example, for receiving a known blower, not shown in detail. The intermediate bottom wall 57 is provided with openings 59 through which the cooling air for the control devices 17 to 21 can circulate. In more favorable installation possibilities it may suffice to use the air which is subjected to the driving air in chamber 58 for cooling the air in housing 1 and thereby the control devices 17 and 21. In this case the intermediate bottom wall 57 has no openings 59.

The total vehicle electronic is installed at a given location in the housing 1 in form of all electric control devices 17 to 21 together with their first detachable connecting means 13 to 16 and the common connecting plate, on the one hand, and their second module like collected individually detachable second connecting means 25 to 28 on the other hand. Thereby, the input signals can be fed in a simple manner through the base plate 22 to the individual control devices 17 to 21. The signal transmission between the individual control devices 17 to 21 is made possible in a shortest possible path through connecting plate 12. Thereby, less interfering influences may be effective at least from the outside, so that the electromagnetic tolerance of the vehicle electronic is increased.

Since the counter socket bars 27 are collected in a module plug, the structured laced wiring consisting of conductors 29 can therefore also be structured like a module depending on the type of the control devices 17 to 21 being mounted in housing 1.

The connection of the individual control devices 17 to 21 with housing 1 by means of the guiding edges 30 and 31 of base plate 22 for the individual control devices which are inserted into the guide grooves 4 of housing 1 and are firmly pressed against it by means of a clamping and locking device 38 to 44 or 47,48 enable a large face heat energy draw off at both sides of base plate 22.

It will be understood that each of the elements described above, or two or more together, may also find a useful application in other types of housings for receiving electric control devices for motor vehicles differing from the types described above.

While the invention has been illustrated and described as embodied in a housing for receiving electric control devices for motor vehicles, it is not intended to be limited to the details shown, since various modifications and structural changes may be made without departing in any way from the spirit of the present invention.

Without further analysis, the foregoing will be fully reveal the gist of the present invention that others can, by applying current knowledge, readily adapt it for various applications without omitting features that, from the standpoint of priot art, fairly constitute essential characteristics of the generic or specific aspects of this invention.

What is claimed as new and desired to be protected by Letters Patent is set forth in the appended claims:

1. In a housing receiving electrical control devices having electrical components, in particular for motor vehicles, which is closed with a lid and comprising a central connecting plate provided with conductor paths and detachable connecting means for a voltage supply, a sensor for each electric control device, each of the control devices being provided with connecting means for mating with said central connecting plate and detachably connected to a laced wire harness which feeds output signals of the control devices to aggregates being controlled, said connecting means being all mounted in the housing, the improvement comprising said housing being formed with recesses and each control device (17 to 21) being provided with a thermally conducting base plate (22) which is inserted into said recesses (4) of said housing (1), said housing having a heat dissipation faces at two sides of said base plate; and at least one locking device (38 to 40; 47, 48) mounted in said housing (1) which tightly holds the base plate (22) against the heat dissipation faces, whereby in an unlocked position of said locking device a portion of the locking device prevents closing of said housing lid (44).

2. The combination in accordance with claim 1, wherein said electrical components (34) of each control device to be cooled are mounted directly on the base plate (22).

3. The combination in accordance with claim 1, wherein the base plate (22) of each control device is pressed into a respective recess of said housing against said heat energy dissipation faces by means of said locking device which includes a detachable clamping device (38 to 40;47, 48).

4. The combination in accordance with claim 1, wherein said locking device is a central clamping device (38 to 40;47, 48) which pushes the base plate (22) of all control devices (17 to 21) at both sides into the recesses (4) of the housing (1) against said heat energy dissipation faces of the housing (1).

5. The combination in accordance with claim 1; wherein a tolerance compensating spring device (41;48) is mounted between said housing (1) and said lid (44).

6. The combination in accordance with claim 1, wherein a spring device (41;48) is provided which is integrated into the locking device (38 to 40; 47, 48) which presses the base plates (22) tightly against the heat energy dissipation faces.

7. The combination in accordance with claim 2, wherein said electrical components are non-insulated on said base plate.

8. The combination in accordance with claim 2, wherein said electrical components are insulated from said base plate.

* * * * *